US007782056B2

(12) United States Patent
Noterdaeme et al.

(10) Patent No.: US 7,782,056 B2
(45) Date of Patent: Aug. 24, 2010

(54) SYSTEMS AND METHODS FOR CORRECTION OF INHOMOGENEITIES IN MAGNETIC RESONANCE IMAGES

(75) Inventors: Olivier Noterdaeme, Oxford (GB); Michael Brady, Oxford (GB)

(73) Assignee: Isis Innovation Ltd., Summertown, Oxford (GB)

( * ) Notice: Subject to any disclaimer, the term of this patent is extended or adjusted under 35 U.S.C. 154(b) by 82 days.

(21) Appl. No.: 12/333,395

(22) Filed: Dec. 12, 2008

(65) Prior Publication Data
US 2009/0206838 A1    Aug. 20, 2009

Related U.S. Application Data

(60) Provisional application No. 61/013,523, filed on Dec. 13, 2007, provisional application No. 61/096,123, filed on Sep. 11, 2008.

(51) Int. Cl.
*G01V 3/00* (2006.01)
(52) U.S. Cl. ........................ 324/309; 324/307
(58) Field of Classification Search ......... 324/300–322; 600/407–445; 382/131
See application file for complete search history.

(56) References Cited

U.S. PATENT DOCUMENTS

| | | | |
|---|---|---|---|
| 6,587,708 B2 * | 7/2003 | Venkatesan et al. | 600/419 |
| 7,324,842 B2 * | 1/2008 | Dale et al. | 600/407 |
| 2008/0292167 A1 * | 11/2008 | Todd et al. | 382/131 |
| 2009/0174403 A1 * | 7/2009 | Lu | 324/307 |
| 2009/0251140 A1 * | 10/2009 | Bhardwaj et al. | 324/307 |

* cited by examiner

*Primary Examiner*—Brij B Shrivastav
(74) *Attorney, Agent, or Firm*—Thomas, Kayden, Horstemeyer & Risley, LLP; Todd Deveau

(57) ABSTRACT

Intensity inhomogeneities can obscure areas of interest and are problematic for MR image segmentation algorithms. An efficient approach to estimating these inhomogeneities by computing a calibration factor that is a function of an estimated bias field from a series of calibration scans is disclosed. This enables correction of $T_1W$ and $T_2W$ images by reducing inhomogeneities without the need to map $T_1$ and $T_2$. Because of interest in the shape of the intensity inhomogeneities a limited number of flip angles yield satisfactory performance. Additionally, an RF transmit field $B_1^+$ can be estimated and inhomogeneities resulting from the $B_1^+$ field reduced from the MR image using the estimated $B_1^+$ field.

21 Claims, 13 Drawing Sheets

SYSTEMS AND METHODS FOR CORRECTION OF INHOMOGENEITIES IN MAGNETIC RESONANCE IMAGES

CROSS-REFERENCE TO RELATED APPLICATION

This application claims the benefit of and priority to U.S. Provisional Patent Application No. 61/013,523, filed Dec. 13, 2007, and U.S. Provisional Patent Application No. 61/096,123, filed Sep. 11, 2008 which are incorporated by reference in their entirety as if fully set forth herein.

TECHNICAL FIELD

The present disclosure generally relates to medical imaging and more particularly, relates to the correction of inhomogeneities in Magnetic Resonance (MR) images. The inhomogeneities can occur in the radiofrequency (RF) receive field ($B_1^-$), as well as in the RF transmit field ($B_1^+$).

BACKGROUND

In the field of Magnetic Resonance Imaging (MRI), intensity inhomogeneities are generally attributed to inhomogeneities in the static field of the magnetic resonance system. For purposes of nomenclature used herein, the phrase intensity inhomogeneity may also be referred to as intensity nonuniformity, bias field, gain field, or shading. This bias field can also be caused by inhomogeneities in the periodic RF pulse. The presence of intensity inhomogeneities within images are also influenced by the distance of the tissue to the coil measuring the signal and of the subject/object being imaged. The resulting effect is sometimes referred to as a bias field, gain field, shading, intensity nonuniformity or intensity inhomogeneity. In particular, the effect is that a given type of tissue will have different intensities depending on where in the image the tissue is located.

Bias fields are problematic because they can adversely impact image quality, for example they can greatly reduce contrast across an image. This can negatively impact clinical decisions being made based on these images. Human vision can to some extent compensate for these effects, but algorithms can do this less well. Bias fields also adversely affect quantitative image analysis, such as segmentation and registration algorithms. The same tissue in different parts of the image can have significantly different image intensities. Bias fields may obscure regions of interest because they are not all visible at a single window/level view. The problems described above are even more pronounced at 3 tesla (T) and higher fields, which are increasingly used field levels.

Reference is made to FIG. 5, which illustrates an example of a homogenous body in a magnetic resonance system in which the corresponding MR image contains intensity inhomogeneities. Ideally, the intensities should be identical throughout the body 600. That is, the color and/or intensity seen throughout the scanned body should be uniform. However, as seen in FIG. 5, the top 602 and bottom 604 regions of the body shown (also referred to as a "phantom") have a higher intensity level, as illustrated by brighter regions. The presence of the intensity inhomogeneity across the phantom is due in part to the fact that this portion of the imaged body is physically closer to the measuring coils used to receive signals.

Conventional approaches to removing intensity inhomogeneities include estimating the bias field through iterative algorithms. However, one perceived shortcoming with this approach is that this approach can be relatively slow. More important perceived shortcomings are the fundamental assumptions built into such algorithms. These approaches often have implicit assumptions about the shape/smoothness of the bias field and do not mobilize the full amount of available information. As such, their performance may be prone to the initialization of the algorithm. Other approaches for addressing intensity inhomogeneity in MR images are discussed in "A Review of Methods for Correction of Intensity Inhomogeneity in MRI" (Vovk et al.; IEEE Transactions on Medical Imaging, Vo. 26, No. 3, March 2007; p. 405-421; B. Belaroussi et al, Med Image Anal, vol. 10, pp. 234-46, 2006; Z. Hou, International Journal of Biomedical Imaging, vol. 2006, ID 49515, doi: 10.1155/IJBI/2006/49515, pp. 11, 2006, and the references therein). These approaches, however, appear to be computationally intensive in nature.

Another known approach to correcting the bias field is based on calibration scans using phantoms. However, one perceived shortcoming with this technique is that this method is generally inappropriate since the bias field depends on the loading of the machine by the tissue of the specific patient. That is, the bias field is very specific to the patient. Generally estimating the bias field from a homogenous phantom will therefore create erroneous results. Another approach involves using calibration scans using different coils. The bias field also depends on the coil which is used to image the patient. As such, using one coil to estimate the bias field while using another coil for the actual imaging process will yield an inaccurate estimate.

Other approaches include physics/pulse sequence based approaches. One such approach involves using proton density weighted images as calibration images. Because the value of the repetition time (TR) of proton density weighted images is very large, it takes a very long time to acquire such images. Stollberger et al. (*Magn Reson Med*, vol. 35, pp. 246-51, 1996) teaches of a method which uses the signal intensity ratio of two images measured with different excitation angles (alpha and 2*alpha) and a repetition time TR$>=5$ $T_1$. With this method, the active bias field can be determined in vivo in 23 cross-sections in less than 6 min. The imaging time is proportional to TR, and therefore, having a long TR ($>=5$ $T_1$) increases the scan time. TR in this instance is about 2000 msec. Longitudinal relaxation time $T_1$ is a tissue specific constant which only depends on the external field. For 3T fields in new MR systems, the $T_1$ increases, which means that this method would take even longer to run. A similar approach (H. Mihara et al *Magma*, vol. 7, pp. 115-20, 1998) to the one taught by Stollberger et al. uses a TR of 1600 msec. TR must be long enough to minimize the effect of $T_1$ relaxation. As such, this means TR$>$(3 to 5)*$T_1$. Thus, at 1.5 T: $T_1$ (liver)~600 msec; $T_1$ (spleen)~1000 msec; $T_1$ (fat)~350 msec; $T_1$ (brain) between 600 msec and 1000 msec.

Inhomogeneities in MR images can also occur in the radio frequency (RF) transmit field $B_1^+$.

Accordingly, various needs exist in the industry to address the aforementioned deficiencies and inadequacies.

SUMMARY

The method of the present disclosure is directed to overcoming the aforementioned disadvantages. For example, the present method is directed to facilitating the visual interpretation of magnetic resonance (MR) images and the successful application of quantitative image analysis algorithms, such as segmentation techniques. Radio frequency (RF) inhomogeneities can result in changes of intensity in such images of up to 30% (Guillemaud R et al. IEEE Trans Med imaging 16(3), 238-251 (1997)). The effect can be modelled as a multiplicative term in the image domain (Id.). In an exemplary embodiment we disclose herein a method for reducing the inhomogeneities that is based on an object/patient specific calibration scan, acquired with a spoiled gradient recalled echo (SPGR) sequence, and demonstrate that the present approach outperforms current techniques.

In another exemplary embodiment, we disclose a method for removing intensity inhomogeneities in magnetic resonance (MR) images that includes the steps of acquiring an MR image, acquiring one or more of calibration images to a compute an estimated bias field, and reducing the estimated bias field from the MR image to derive an MR in which inhomogeneities have been reduced.

In yet a further embodiment, we disclose a method for removing intensity inhomogeneities in magnetic resonance (MR) images that includes acquiring an MR image for body of tissue using a scanner, acquiring one or more calibration images to compute an estimated bias field, calculating a calibration factor $M_0$, that is proportional to the estimated bias field from the one or more calibration images, wherein $M_0$ is a function of gain setting g associated with the scanner and proton density ρ, and reducing the estimated bias field from the MR image through use of the calibration factor $M_0$ in order to derive an MR image in which inhomogeneities have been reduced.

In yet a further embodiment, the SPGR signal equation is a function of scanning parameters (TR, TE, α) and tissue properties ($T_1$, $T_2^*$, ρ) which depend on the spatial location $\bar{x}$. The inhomogeneity in an MR image can be modelled as a multiplicative term $\bar{B}$, referred to herein as a bias field, resulting in the signal equation:

$$S(\bar{x}) = g\rho e^{-TE/T_2^*} \sin\alpha \{(1-e^{-TR/T_1})/(1-\cos\alpha e^{-TR/T_1})\}\bar{B}$$

At location $\bar{x}$ we have the observed signal S, scanner gain g, repetition time TR, echo time TE, flip angle α, proton spin density ρ, longitudinal relaxation time $T_1$ and transverse relaxation time $T_2^*$. By keeping all parameters except flip angle α constant it is possible to linearize the equation and estimate $T_1$ and a calibration factor $M_0$, where $M_0 = g\rho e^{-TE/T_2^*}\bar{B}$, by any suitable linear regression. When TE<<$T_2^*$ then $e^{-TE/T_2^*} \approx 1$ and $M_0 \approx g\rho\bar{B}$. This means the calibration factor $M_0$ contains all the artifacts from the inhomogeneity. Spin echo, Inversion Recovery and Gradient Recalled Echo and many other MR sequences and their variations are all of the form $S(\bar{x}) \propto g\rho\bar{B}$. Inhomogeneities in $T_1$ ($T_1$W) and $T_2$ weighted ($T_2$W) images can thus be removed from the acquired image using the calibration factor $M_0$ computed from multiple flip angle acquisitions acquired at the beginning of an exam and deducting $M_0$ from the acquired MR image.

In yet another embodiment, we disclose a method for removing inhomogeneities in MR images in the radiofrequency (RF) transmit ($B_1^+$) field. In addition to the computation or mapping of an estimated bias field and reducing the estimated bias field from the MR image, this embodiment includes the steps of calculating or mapping an estimated RF transmit $B_1^+$ field based on one or more image acquisitions and removing or reducing the estimated $B_1^+$ field from the MR image to derive an MR image in which inhomogeneities have been reduced from both the bias field (also referred to as the RF receive field $B_1^-$) as well as from the RF transmit field $B_1^+$.

Other systems, devices, features, and advantages of the disclosed method for removing intensity inhomogeneities in magnetic resonance images will be or will become apparent to one with skill in the art upon examination of the following drawings and detailed description. All such additional systems, devices, features, and advantages are intended to be included within this description, are intended to be included within the scope of the present invention, and are intended to be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

calculated for a range of echo time TE and transverse relaxation time $T_2$ for both a 3D plot and a top view, respectively.

Figure 2A:
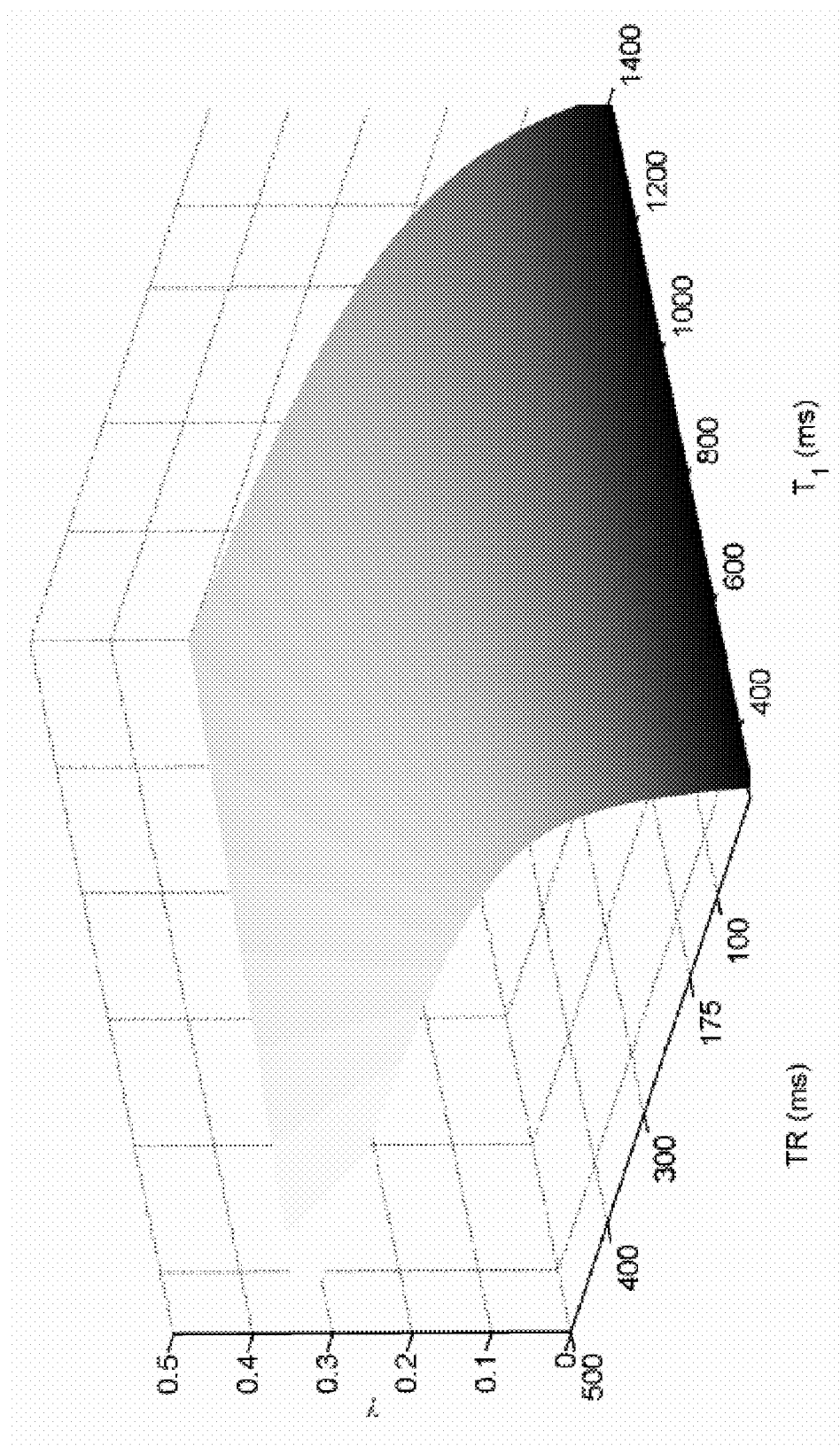
Figure 2B:
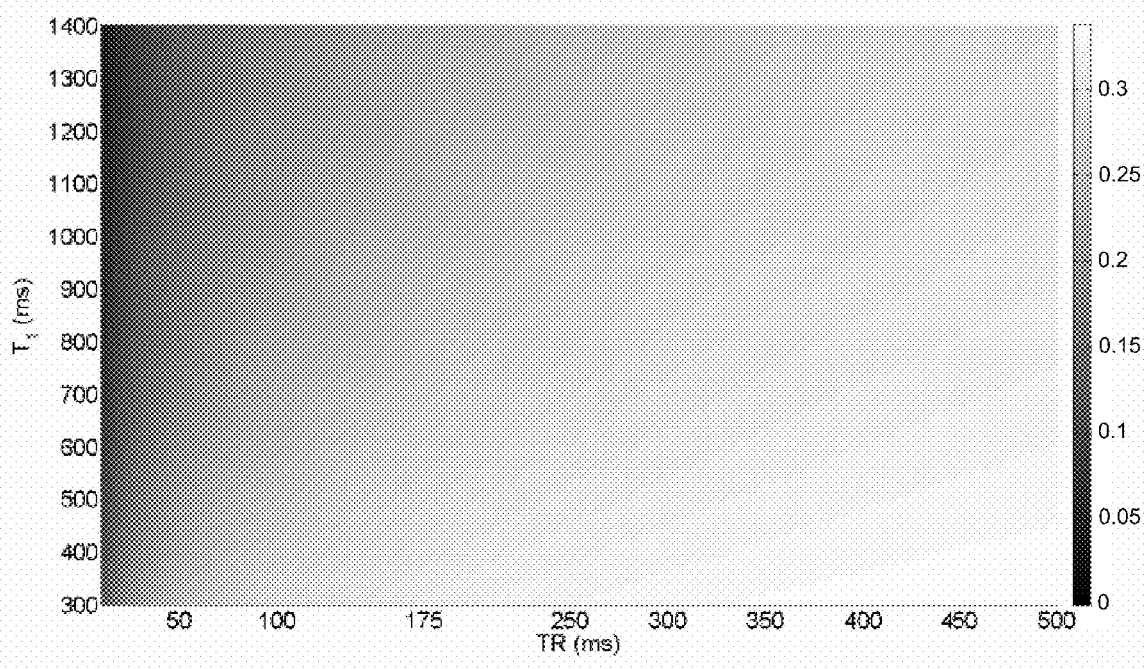

FIGS. 2 (a),(b) illustrate the value for γ for a range of repetition times TRs and physiological longitudinal relaxation time $T_1$ values for both a 3D plot and a top view, respectively.

Figure 3:
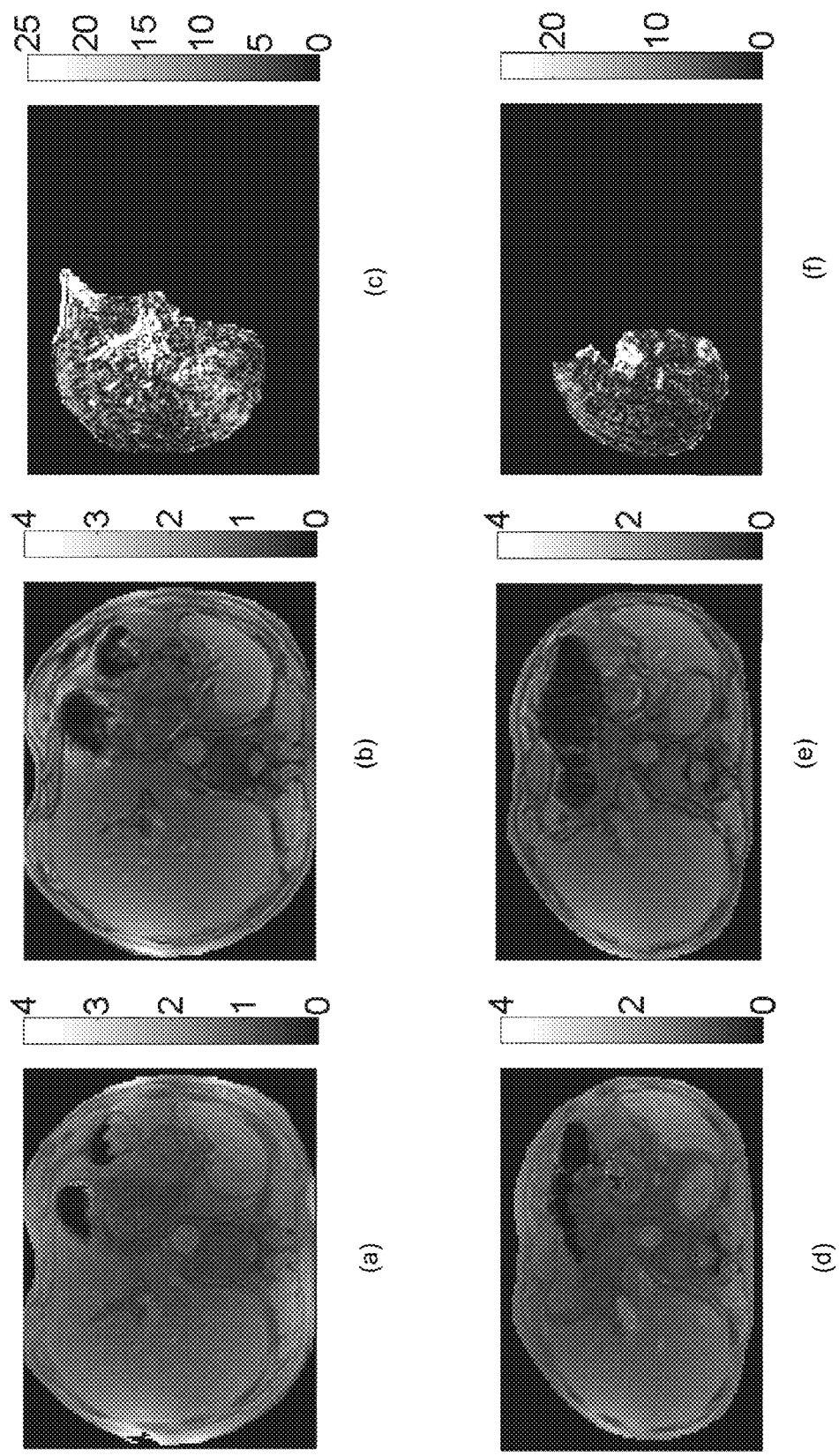

FIGS. 3 (a)-(f) show calibration factors $M_0$, $M_0^{Bold}$ and the percentage difference between the two parametric maps for two patients.

Figure 4:
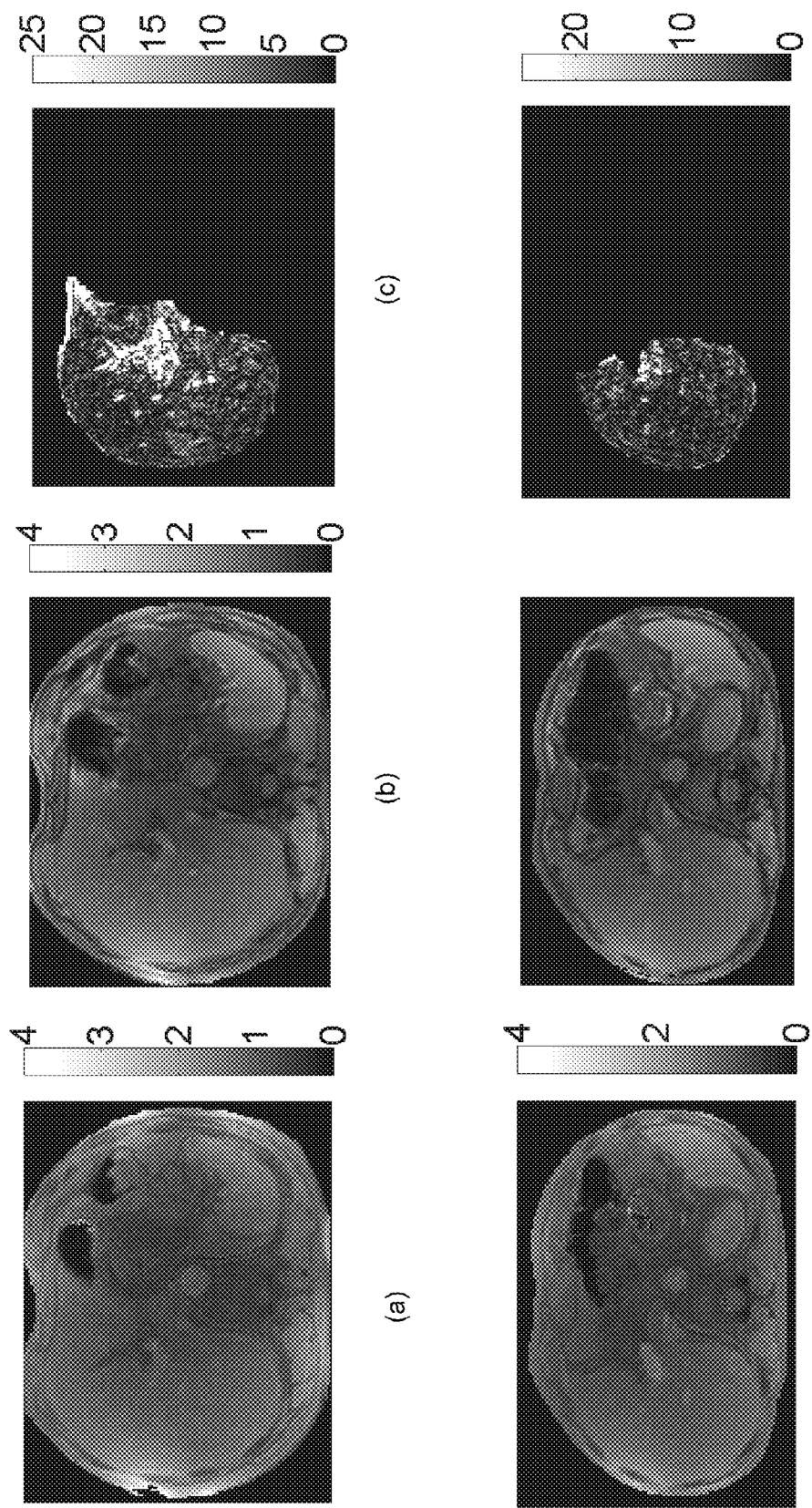

FIGS. 4 (a)-(f) show calibration factors $M_0$, $M_0^{Bold}/\gamma$ and the percentage difference between the two parametric maps for the same two patients in FIGS. 3 (a)-(f).

Figure 5:
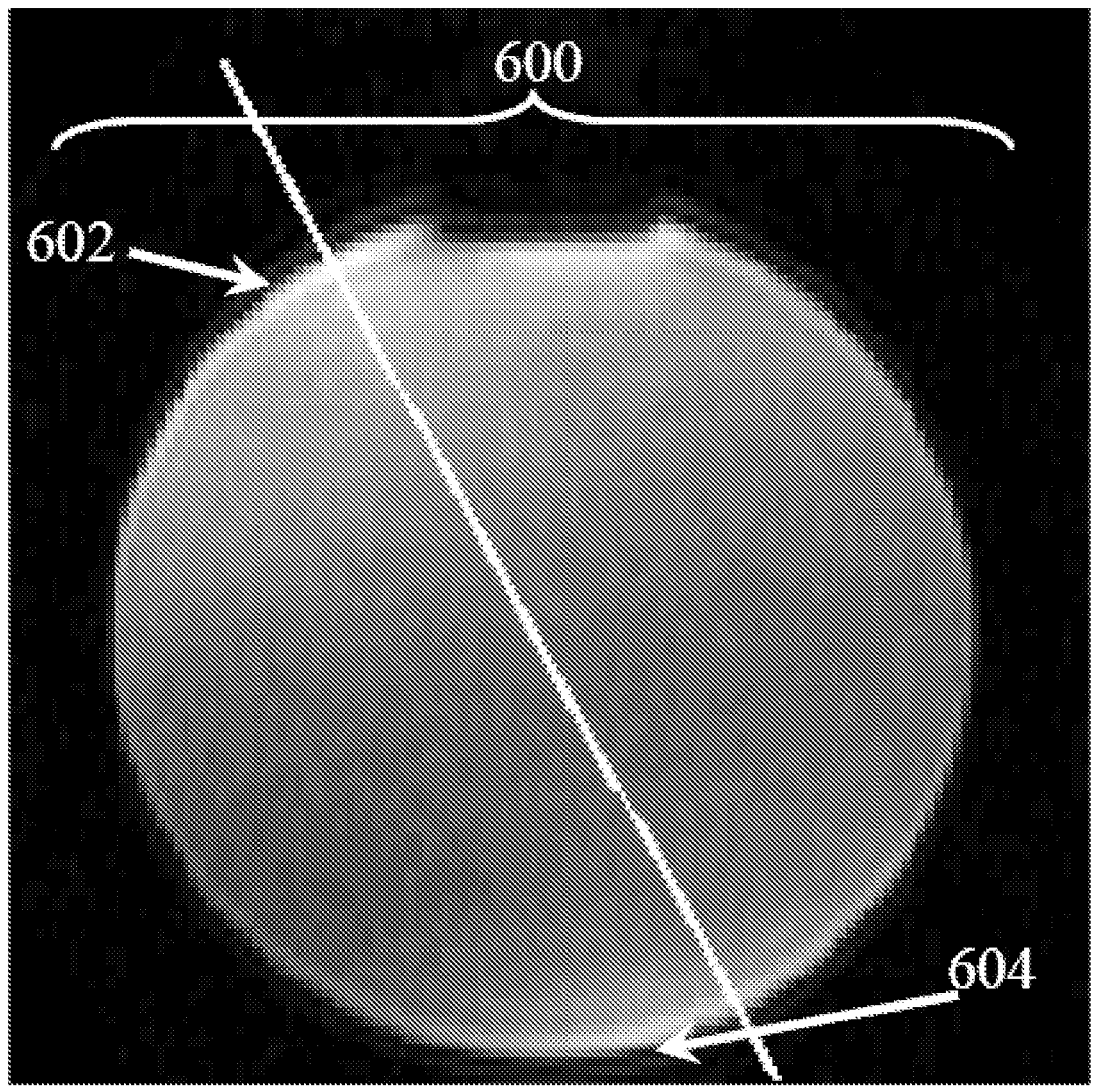

FIG. 5 illustrates an example of a homogenous body in a magnetic resonance system containing intensity inhomogeneities.

Figure 6:
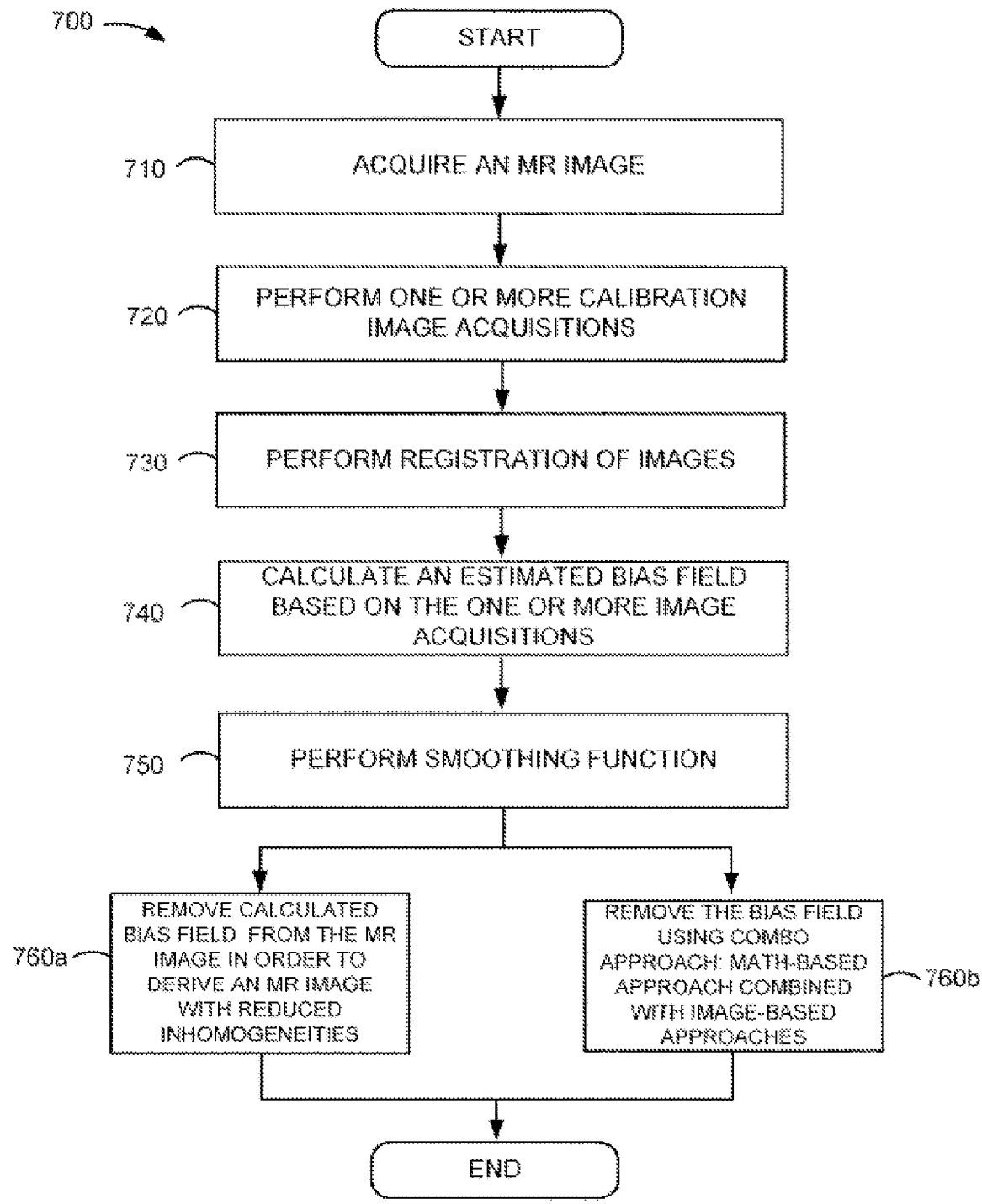
Figure 7A:
Figure 7A:
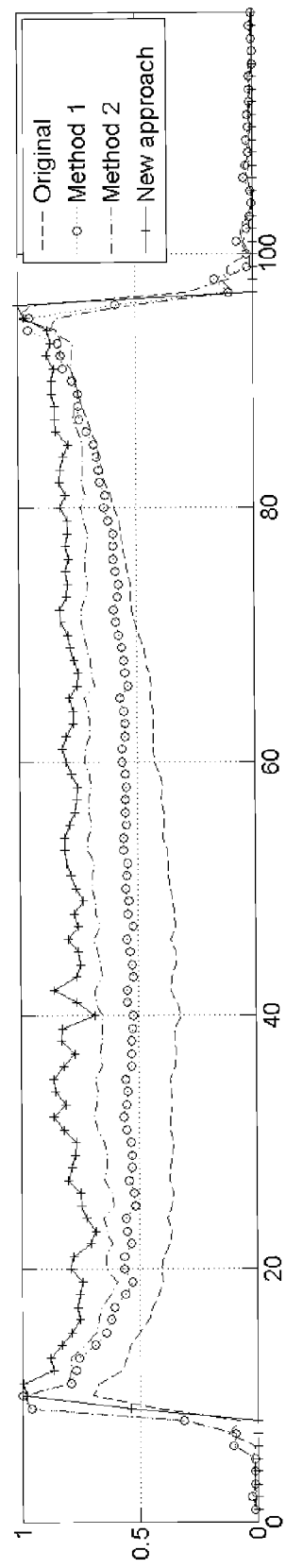
Figure 7B:
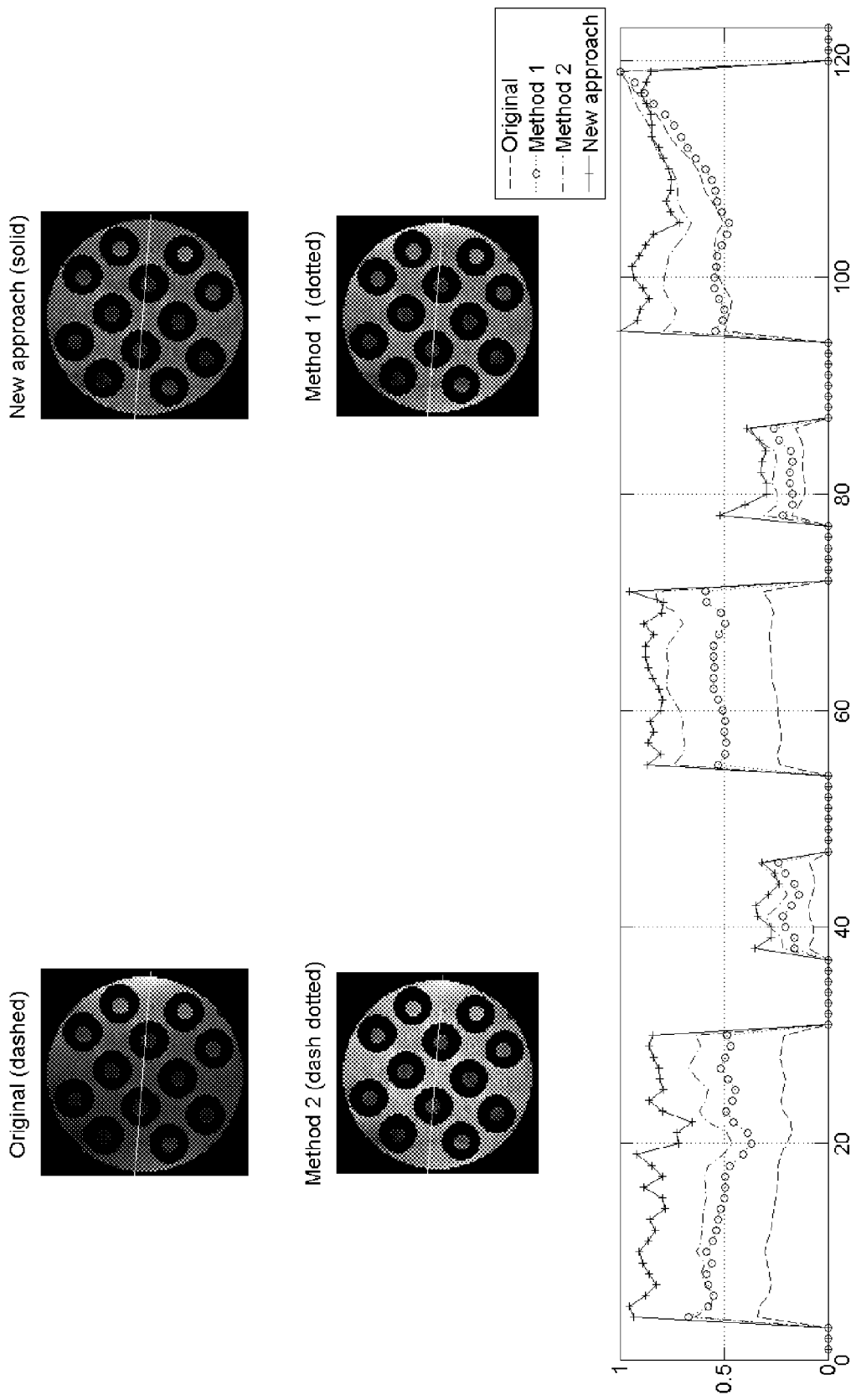
Figure 7C:
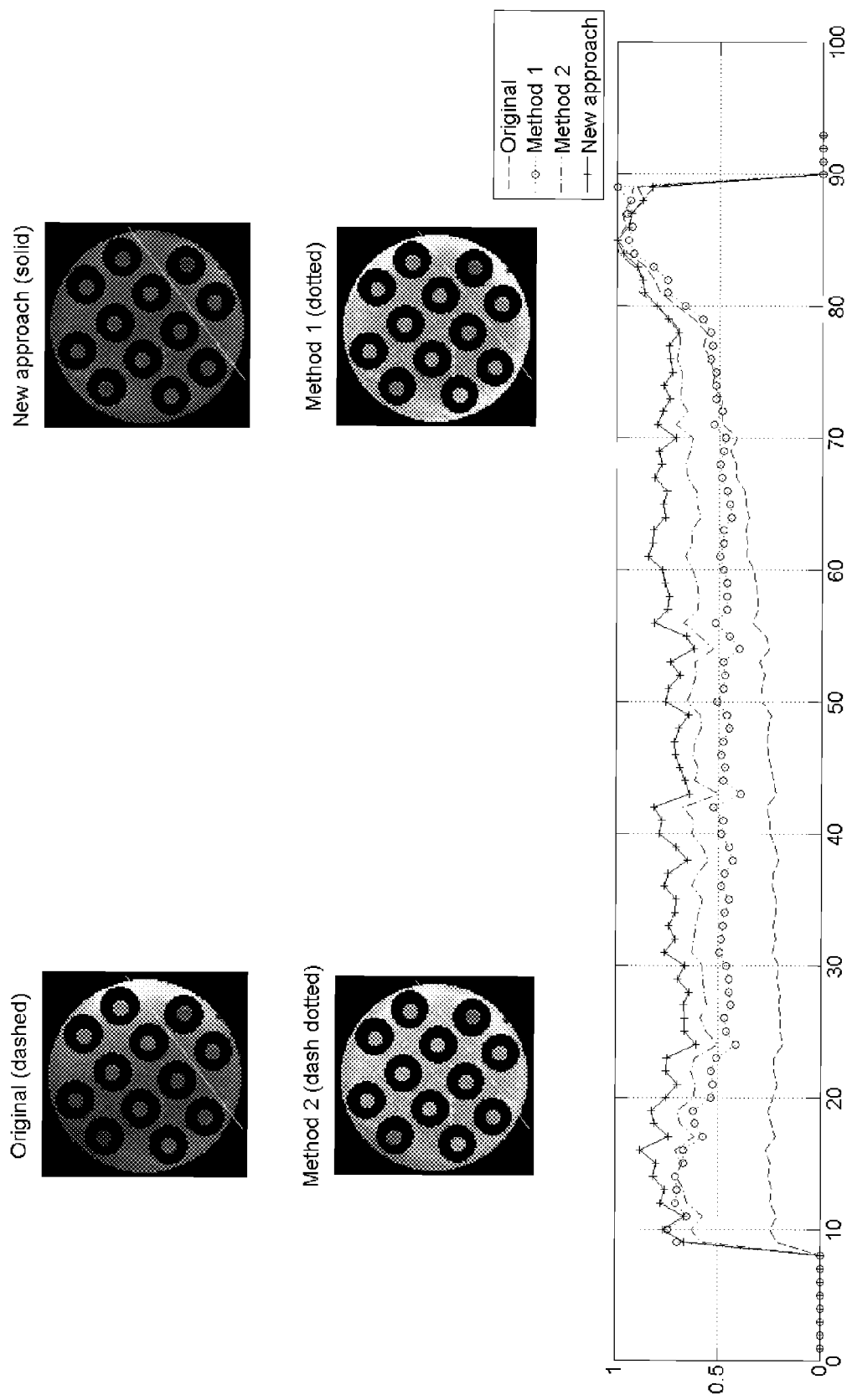
Figure 7D:
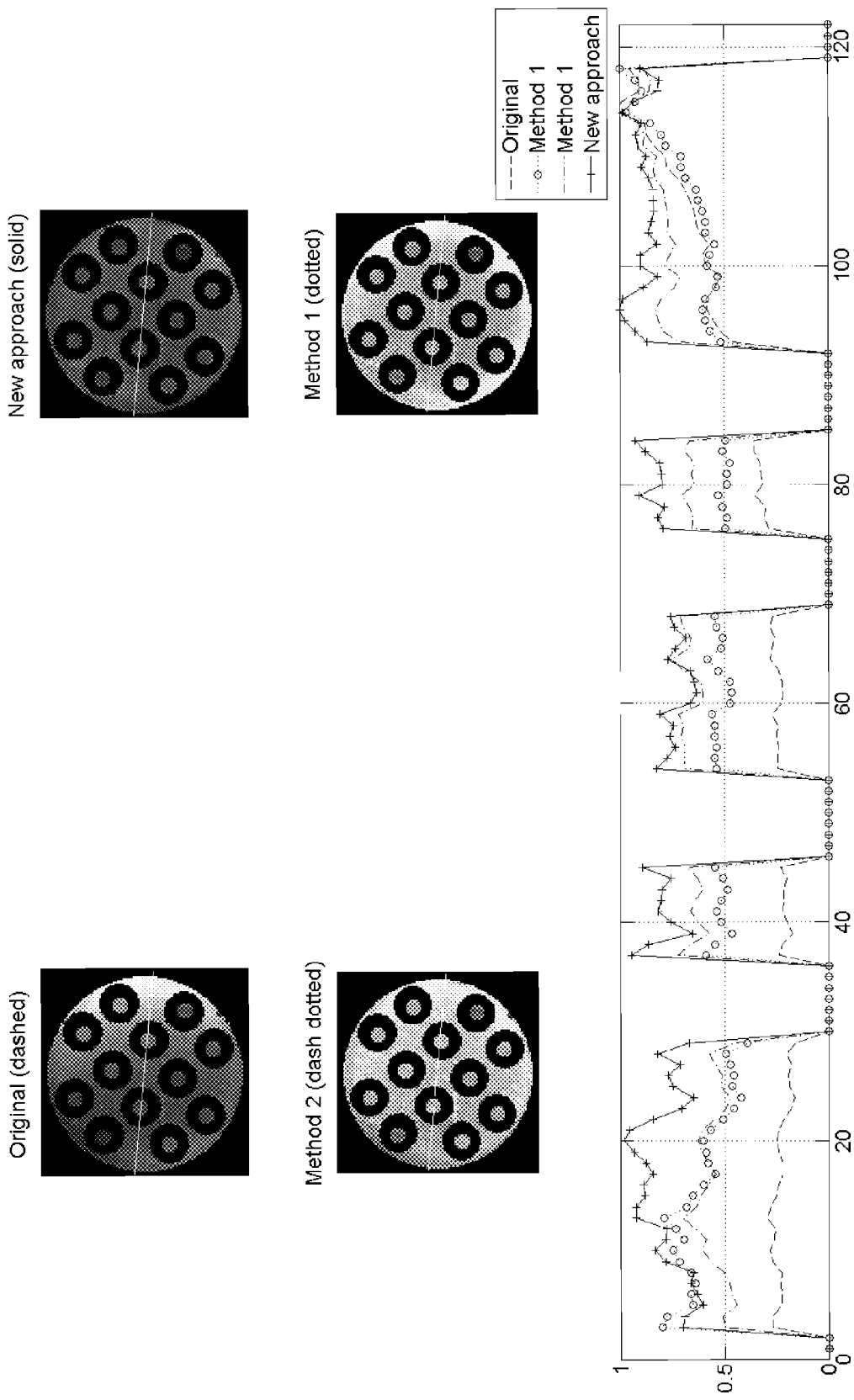

FIG. 6 is a flowchart of an exemplary embodiment of a method for removing intensity inhomogeneities of the present disclosure from an MRI image.

FIGS. 7A-D show the results for various approaches to bias field removal compared to an exemplary embodiment of the present disclosure.

Figure 8:
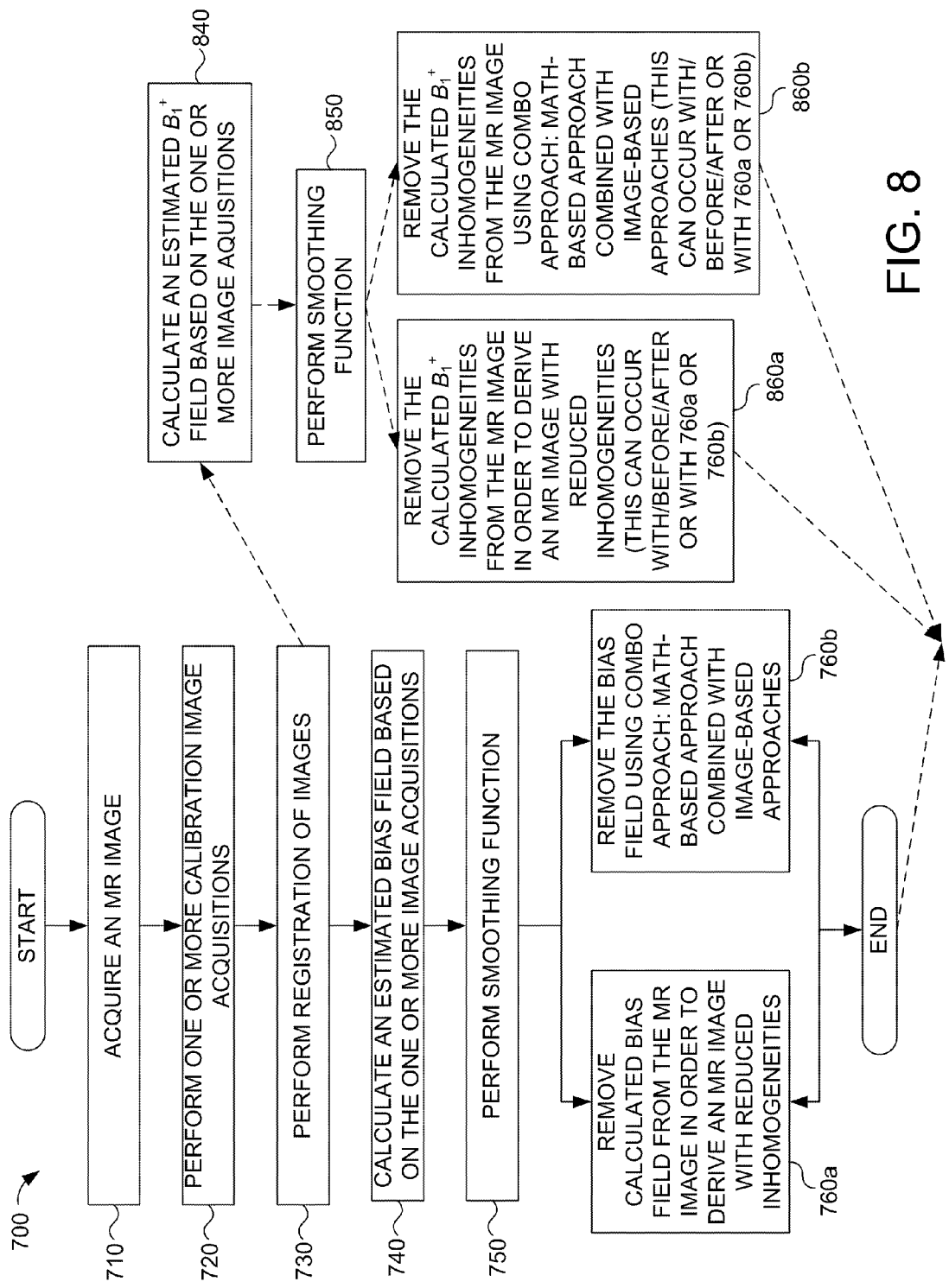

FIG. 8 is a flow chart of an alternate embodiment to the method illustrated in FIG. 6, further including estimating the RF transmit field $B_1^+$ and removing inhomogeneities in the $B_1^+$ field from an MR image using the estimated $B_1^+$ field.

DETAILED DESCRIPTION

Having summarized various aspects of the present disclosure, reference will now be made in detail to the description of the disclosure as illustrated in the drawings. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Embodiments of systems and methods are described herein which utilize one or more acquired calibration images to provide a fast, low-cost solution for correcting and removing intensity inhomogeneities in magnetic resonance (MR) images. The acquisition of the one or more calibration images can be based on the signal equation of MR sequences, which generally follow a certain pattern, described below. Through the acquisition of the one or more calibration images, it is possible obtain a very good estimated map of the actual intensity inhomogeneities.

A general framework for bias field removal (i.e., removing intensity inhomogeneities) using the parameter or calibration factor $M_0$ is now described. First, the Ultrafast Gradient Echo (in 2D or 3D) signal (sometimes referred to as the fast spoiled gradient echo (FSPGR) signal, or TurboFLASH or MPRAGE, or TFE or 3DTFE, or RGE or MPRAGE, or FastFE, or Field Echo) at any voxel is given by the signal equation:

$$S^{ideal} = g\rho e^{-TE/T_2^*} \sin\alpha \left( \frac{1 - e^{-TR/T_1}}{1 - \cos\alpha \cdot e^{-TR/T_1}} \right) \quad (1)$$

The scanner gain g, repetition time TR, echo time TE and flip angle $\alpha$ are sequence parameters and are independent of the spatial location. However, tissue parameters such as the proton density $\rho$, longitudinal relaxation time $T_1$ and the transverse relaxation time $T_2$ or $T^*_2$ are all a function of the spatial location (x,y,z). It immediately follows that the following holds true for the resulting signal: $S^{ideal}=f(x,y,z)$. However, the signal is often contaminated by a bias field $\vec{B}$, which is itself a function of the spatial location. With the method described in the following steps we estimate the bias field $\vec{B}$ at a plurality of positions x, y and z and so we can suppress mention of it in the following equations and consider the signal equation and bias field at a plurality of voxels. This means that the estimated bias field $\vec{B}$ computed this way, when viewed spatially could be of entirely general shape and does not carry with it the assumptions implicitly made in iterative correction algorithms (for example, the shape/smoothness of the bias field, see section [0005] above). In one embodiment the bias field can be estimated independently at each position x, y and z and so we can consider the signal equation and bias field at each voxel and also where each position can be either regularly or irregularly spaced.

The bias field $\vec{B}$ can be modeled as a multiplicative field, resulting in an Observed Signal $S^{obs}$, where:

$$S^{obs} = S^{ideal} \cdot \vec{B} \quad (2)$$

$$S^{obs} = g\rho e^{-TE/T_2^*} \sin\alpha \left( \frac{1 - e^{-TR/T_1}}{1 - \cos\alpha \cdot e^{-TR/T_1}} \right) \cdot \vec{B} \quad (3)$$

Re-arranging this equation yields:

$$S^{obs} \cdot (1 - \cos\alpha \cdot e^{-TR/T_1}) = g\rho e^{-TE/T_2^*} \sin\alpha (1 - e^{-TR/T_1}) \cdot \vec{B} \quad (4)$$

$$\frac{S^{obs}}{\sin\alpha} = e^{-TR/T_1} \frac{S^{obs}}{\tan\alpha} + g\rho e^{-TE/T_2^*}(1 - e^{-TR/T_1}) \cdot \vec{B} \quad (5)$$

By performing the following substitutions, $$\frac{S^{obs}}{\sin\alpha} = e^{-TR/T_1} \frac{S^{obs}}{\tan\alpha} + g\rho e^{-TE/T_2^*} \cdot \vec{B}\left(1 - e^{-TR/T_1}\right) \quad (6)$$

The following equation is derived:

$$\frac{\overset{(y)}{S^{obs}}}{\sin\alpha} = \overset{(a)}{E_1} \frac{\overset{(x)}{S^{obs}}}{\tan\alpha} + \overset{(b)}{M_0(1 - E_1)} \quad (7)$$

It should be noted that equation above is of the linear form, y=ax+b. As such, the slope (a) and the y-intercept (b) can be estimated for example by any suitable linear regression. By using one or more calibration image acquisitions, preferably a plurality of such acquisitions, where only the flip angle $\alpha$ varies, it is possible to calculate $T_1$ and calibration factor $M_0$ using the following equations:

$$T_1 = -\frac{TR}{\ln a} \quad (8)$$

$$M_0 = \frac{b}{1-a} \quad (9)$$

It should be emphasized that the calculation of $T_1$, the longitudinal relaxation time, is independent of any bias field $\vec{B}$. However, the calculation of $M_0$ is corrupted by the multiplicative bias field $\vec{B}$ because $M_0 = g\rho e^{-TE/T_2^*}\vec{B}$. While the bias field $\vec{B}$ cannot be computed, the equation for $M_0$ can be solved, which in fact, is $M_0^{true} \times \vec{B}$. When the echo time (TE) is very short, such as with Despot1 (Deoni et al. *Magn Reson Med*, vol. 49, pp. 515-26, 2003) and with most fast 3D imaging sequences, the following holds true: $e^{-TE/T_2^*} \approx 1$.

Figure 1A:
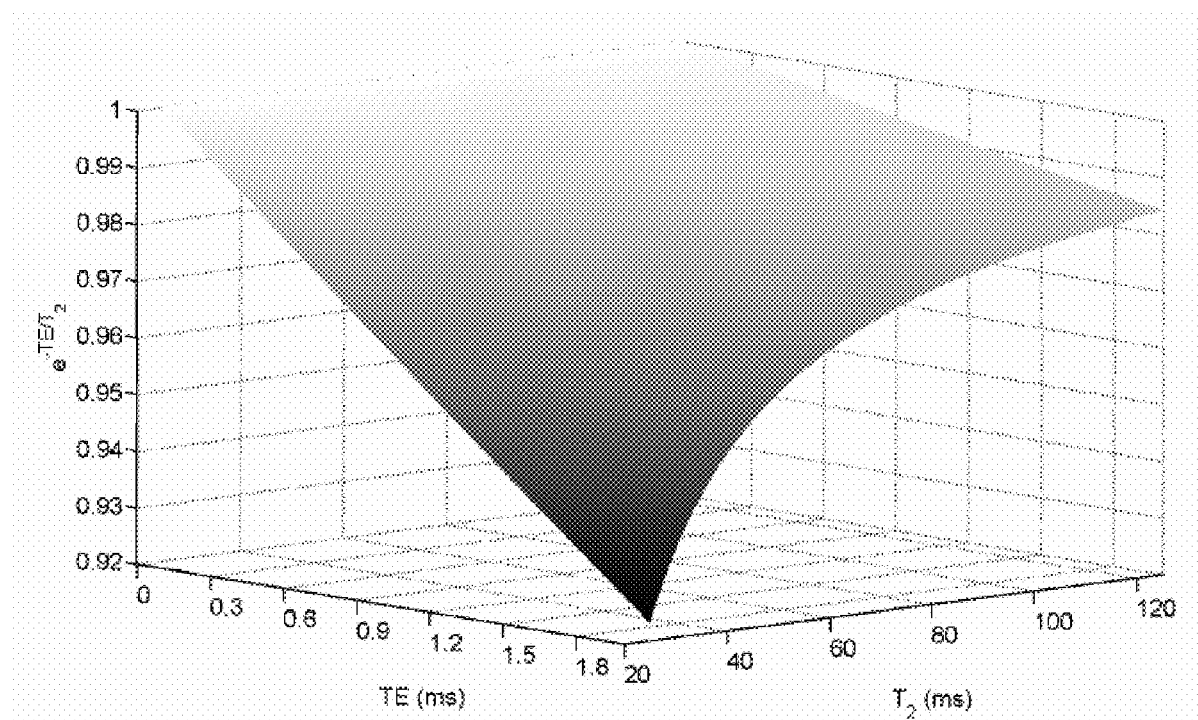
FIGS. 1 (a),(b) show the value for $$e^{\frac{-TE}{T_2}}$$
Figure 1B:
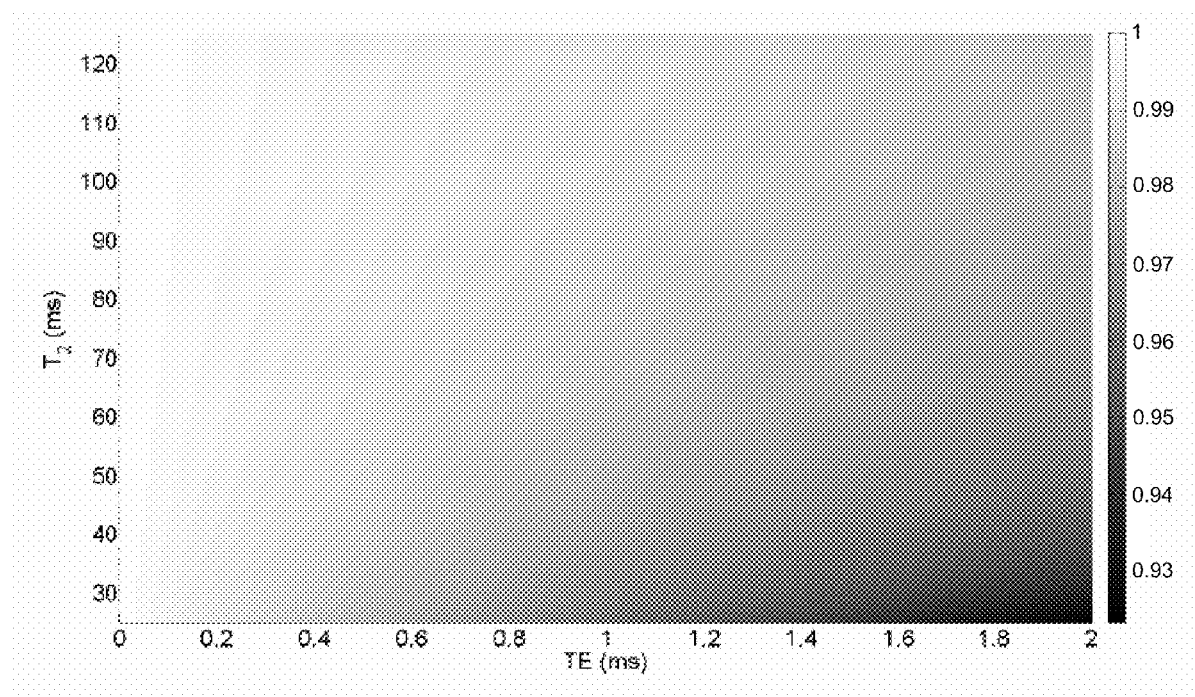

FIGS. 1 (a),(b) illustrate $e^{-TE/T_2}$ calculated for a range of TE and $T_2$. FIG. 1 (a) shows a 3D plot, and FIG. 1(b) shows a top view where the value of $e^{-TE/T_2}$ can be seen from the color bar. For TE<1.5 msec the term $e^{-TE/T_2}$ never drops below 0.95, making $e^{-TE/T_2} \approx 1$ a reasonable assumption.

Table 1 provides numerical values for this term across a range of abdominal tissues.

TABLE 1

| Tissue | $T_2$ (msec) +/− std | $\frac{-TE}{e^{T_2+std}}$ | $\frac{-TE}{e^{T_2}}$ | $\frac{-TE}{e^{T_2-std}}$ |
|---|---|---|---|---|
| Kidney Cortex | 87 ± 4 | 0.9869 | 0.9863 | 0.9856 |
| Kidney Medulla | 85 ± 11 | 0.9876 | 0.9860 | 0.9839 |
| Liver | 46 ± 6 | 0.9772 | 0.9743 | 0.9704 |
| Spleen | 79 ± 15 | 0.9873 | 0.9849 | 0.9814 |
| Pancreas | 46 ± 6 | 0.9772 | 0.9743 | 0.9704 |
| Paravertebral muscle | 27 ± 8 | 0.9663 | 0.9565 | 0.9388 |
| Bone marrow | 49 ± 8 | 0.9792 | 0.9758 | 0.9712 |
| Subcutaneous fat | 58 ± 4 | 0.9808 | 0.9795 | 0.9780 |
| Uterus Myometrium | 117 ± 14 | 0.9909 | 0.9898 | 0.9884 |
| Prostate | 88 ± 0 | 0.9865 | 0.9865 | 0.9865 |

Table 1 shows the average $T_2$ relaxation times at 1.5T and the calculated value for $e^{-TE/T_2}$ for TE=1.2 msec. It should be noted that $T_2 > T^*_2$, but $e^{-TE/T_2^*} \approx 1$ still holds because $TE \ll T^*_2$.

Under these circumstances (i.e., for a short TE), the following holds true:

$$M_0 = g\rho e^{-TE/T_2^*} \cdot \vec{B} \approx g\rho \cdot \vec{B} \quad (10)$$

It should be noted that when $M_0$, which is proportional to the bias field, is computed from multiple Ultrafast Gradient Echo images with varying $\alpha$ and short TE values, $M_0$ is corrupted by the bias field but only contains a negligible contribution from the transverse tissue relaxation time $T^*_2$. If another image with different, arbitrary, sequence parameters TR, TE and α is acquired, it is possible to remove the bias field from this image through, for example, a simple division operation. This image can for example be another Ultrafast Gradient Echo image, but it can also be a Spin Echo, Inversion Recovery or variations thereof or any other image sequence. Let us for example consider an Ultrafast Gradient Echo image. In this image to be corrected the new values are denoted by a ˆ symbol shown over each corresponding variable. The tissue properties, $T_1$, $T^*_2$ and the proton density ρ of each observed voxel remain unchanged. Also, the gain settings, g, of the scanner may or may not have remained constant. Let us consider the case of constant gain, when the observed signal is given by:

$$\hat{S}^{obs} = g\rho e^{-\hat{T}E/T^*_2} \sin\hat{\alpha} \left( \frac{1 - e^{-\hat{T}R/T_1}}{1 - \cos\hat{\alpha} \cdot e^{-\hat{T}R/T_1}} \right) \cdot \hat{\vec{B}} \quad (11)$$

The observed signal $S^{obs}$ is contaminated by a bias field denoted by a bias field $\vec{B}$ which is not influenced by the flip angle or other parameters used in the scanning process. It is thus appropriate to assume that the following holds true:

$$\hat{\vec{B}} = \vec{B} \quad (12)$$

After making this observation, equation 11 is divided by equation 10 (which defines the parameter or calibration factor $M_0$) to obtain a signal which is independent of the bias field:

$$\frac{\hat{S}^{obs}}{M_0} = g\rho e^{-\hat{T}E/T^*_2} \sin\hat{\alpha} \left( \frac{1 - e^{-\hat{T}R/T_1}}{1 - \cos\hat{\alpha} \cdot e^{-\hat{T}R/T_1}} \right) = \frac{S^{ideal}}{g\rho} \quad (13)$$

It should be noted that the exemplary method described is not limited to abdominal tissue. The only requirement is that $e^{-TE/T^*_2} \approx 1$, which is generally true for all tissue types provided that TE is very short. More importantly, the application of the correction is not limited to a particular image type such as Ultrafast Gradient Echo images. As an example, the observed signal equation for other sequences are[1]:

[1] http://www.cis.rit.edu/htbooks/mri/inside.htm $$\text{Spin Echo: } S^{obs} = \vec{B}g\rho e^{\frac{-TE}{T^*_2}} \left( 1 - e^{\frac{-TR}{T_1}} \right) \quad (14)$$

$$\text{Inversion Recovery 180/90: } S^{obs} = \vec{B}g\rho \left( 1 - 2e^{\frac{-TI}{T_1}} + e^{\frac{-TR}{T_1}} \right) \quad (15)$$

$$\text{Inversion Recovery 180/90/180: } S^{obs} = \vec{B}g\rho e^{\frac{-TE}{T^*_2}} \left( 1 - 2e^{\frac{-TI}{T_1}} + e^{\frac{-TR}{T_1}} \right) \quad (16)$$

Every equation is preceded by the factor $\vec{B}g\rho$ which can be removed by, for example, dividing the signal equation with equation 10. The spin echo, inversion recovery and other MR image sequences and variations thereof all follow the same pattern containing a factor proportional to $\vec{B}g\rho$. Thus, a series of calibration images can be obtained that follow the same basic pattern as the MR image having inhomogeneities to be removed. By obtaining $M_0$ according to the exemplary method described, it is possible to correct any acquired image and obtain an image that is determined purely by the tissue properties $T_1$ and $T^*_2$ while being independent of the bias field $\vec{B}$ and ρ. The relative contribution of each property (i.e., the type of weighting) depends on the sequence parameters chosen. See Table 2 below, which shows image weighting as a function of the sequence parameters:

TABLE 2

| Weighting | TR | TE |
|---|---|---|
| $T_1$ | $\leq T_1$ | $<< T_2$ |
| $T_2$ | $>> T_1$ | $\geq T_2$ |
| ρ | $>> T_1$ | $<< T_2$ |

In the case of liver imaging, images are either heavily $T_1$ weighted or $T_2$ weighted ($T_1W$ or $T_2W$).

The effect of the described correction on $T_1W$ images is to increase the apparent $T_1W$, while on $T_2W$ images the apparent $T_2W$ is slightly decreased. This small decrease in $T_2W$ could be compensated by acquiring images with a slightly longer TE than desired. However, the reduction in $T_2W$ is likely to have a negligible visual effect on the images.

Note, that $T_2$ is approximately constant for a given tissue and patient. In an ideal scenario $T_2$ and $T^*_2$ are identical. However, for example due to inhomogeneities, we always have that $T^*_2 < T_2$. For our application we require $e^{-TE/T^*_2} \approx 1$, which is fulfilled as long as $TE << T^*_2$ which is generally the case if we use a very short TE.

Prior to correction of the uncorrected image with the estimated $M_0$, it may be desirable to smoothen the $M_0$ parametric image. This can reduce any effect from differences in proton density ρ and differences in $T_2/T^*_2$ on $M_0$ and thus yield a corrected image where these differences are maintained.

$T_2W$ Images

An alternative approach to obtain images which are free from the bias field is computation of images from parameters which are free from the bias field. As described earlier, the estimation of $T_1$ is not affected by the bias field. One such approach is thus the reconstruction of synthetic $T_1$ weighted images as described for example by Deoni et al. (Magn Reson Imaging 2006; 24(9):1241-8). However, as the transverse tissue relaxation time $T_2$ and $T^*_2$ is unknown, it is only possible to compute $T_1W$ images. The reconstruction of $T_2$ weighted images would require the measurement of $T_2$, which takes additional time. It is also not possible to correct contrast enhanced images. However, as discussed earlier, the parameter $M_0$ possesses various favorable properties that enables the correction of inhomogeneities in both $T_1W$ and $T_2W$ images. Generally, it is better to sample each type of image "freshly" and correct for the inhomogeneities in these images according to exemplary embodiments described rather than to reconstruct synthetic images from $T_1$ and $T_2$ maps which were computed from multiple noisy images. Using noisy $T_1$ and $T_2$ maps will inevitably result in noisy synthetic images. Errors in the synthetic images cannot be corrected, as the data they are based on is noisy. However, it should be emphasized that $M_0$ maps can be used to correct acquired data and there are techniques to adequately deal with noise in the computation of $M_0$ maps. In practice $\vec{B}$ turns out to appear piecewise smooth and so we can use this information in combination with or in noise suppression techniques/ algorithms. Intensity inhomogeneities are independent of the pulse sequence and therefore only need to be estimated once per imaging study provided that the patient remains still. Should the patient not remain still, then it is possible to use one of the many motion correction, also called alignment or image registration techniques, in combination with the present method. Some of these methods are described by Hill et al. (*Phys Med Biol*, vol. 46, pp. R1-45, 2001) and Maintz et al. (*Med Image Anal*, vol. 2, pp. 1-36, 1998) and Mellor et al. (*Med Image Anal*, vol. 9, pp. 330-43, 2005) and the references contained therein. The correction can be, but is not limited to, rigid, non-rigid, affine and locally affine.

Another favorable property related to $M_0$ is the fact that the bias field is independent of the image sequence itself. To demonstrate this characteristic, an alternative approach for determining $M_0$ that uses a different pulse sequence with a different set of sequence parameters was performed. Using a series of gradient echo images, where all parameters but TE remain constant, it is possible to estimate $T^*_2$ and a parameter which will be referred to as $M_0^{Bold}$. The analysis is based on the signal equation.

$$S^{ideal} = g\rho e^{\frac{-TE}{T^*_2}} \sin\alpha \left( \frac{1 - e^{\frac{-TR}{T_1}}}{1 - \cos\alpha \cdot e^{\frac{-TR}{T_1}}} \right) \quad (17)$$

As previously stated, the signal is contaminated by a bias field $\vec{B}$ which can be modeled as a multiplicative field, resulting in:

$$S^{observed} = S^{ideal} \cdot \vec{B} \quad (18)$$

$$S^{observed} = g\rho e^{-TE/T^*_2} \sin\alpha \left( \frac{1 - e^{-TR/T_1}}{1 - \cos\alpha \cdot e^{-TR/T_1}} \right) \cdot \vec{B} \quad (19)$$

This equation can be re-arranged as follows:

$$\ln(S^{observed}) = -\frac{1}{T^*_2} \cdot TE + \ln\left( g\rho \sin\alpha \left( \frac{1 - e^{-TR/T_1}}{1 - \cos\alpha \cdot e^{-TR/T_1}} \right) \cdot \vec{B} \right) \quad (20)$$

Using the following substitution, $$\ln(S^{observed}) = -\frac{1}{T^*_2} \cdot TE + \ln\left( \frac{M_0^{Bold}}{g\rho \sin\alpha \left( \frac{1 - e^{-TR/t_1}}{1 - \cos\alpha \cdot e^{-TR/T_1}} \right) \cdot \vec{B}} \right) \quad (21)$$

the equation simplifies to:

$$\underbrace{\ln(S^{observed})}_{y} = -\underbrace{\frac{1}{T^*_2}}_{a} \cdot \underbrace{TE}_{x} + \underbrace{\ln(M_0^{Bold})}_{b} \quad (22)$$

which again, is of the linear form y=ax+b. Using any suitable linear regression it is possible to estimate the slope, a, and the y-intercept, b and thus determine $T^*_2$ and $M_0^{Bold}$. It should be noted that similar to the calculation of $T_1$, the computation of $T^*_2$ is independent of any bias field. The calculation of $M_0^{Bold}$ is corrupted by the multiplicative bias field $\vec{B}$.

Relationship Between $M_0$ and $M_0^{Bold}$

The following relationship holds true: $M_0^{Bold} = \gamma M_0$, where $$\gamma = \sin\alpha \left( \frac{1 - e^{-TR/T_1}}{1 - \cos\alpha \cdot e^{-TR/T_1}} \right).$$

Depending on the choice of sequence parameters, the value of γ can vary significantly. FIGS. 2 (*a*),(*b*) show the value of γ for a range of $T_1$ and TRs when α=20° for both a 3D plot and a top view.

At 1.5 T, a realistic range of $T_1$ values is between $T_{1,min}$=300 ms for subcutaneous fat and $T_{1,max}$=1400 ms for parts of the kidney and cancerous deposits. Accordingly to experiments that have been performed, TR=175 ms which results in $\gamma_{min}$=0.2354 and $\gamma_{max}$=0.31782. If $M_0$ and $M_0^{Bold}$ are compared, a similar shape can be expected. However, there are likely to be significant differences because of the γ term.

FIGS. 3 (*a*)-(*f*) show $M_0$ (left, FIGS. 3 (*a*),(*d*)), $M_0^{Bold}$ (middle, FIGS. 3 (*b*),(*e*)) and the percentage difference (right, FIGS. 3 (*c*),(*f*)) between the two parametric maps for two patients. Looking at the general shape of $M_0$ and $M_0^{Bold}$ we observe similarities in shape. However, there are clear differences in the intensities of certain tissues. Focusing on the liver, 3(*c*) and 3(*f*), we observe significant differences. These occur in areas where the value of γ changes because of variations in the underlying $T_1$. Inside the liver large errors occur around blood vessels and tumor deposits. Large errors are indicated by pixels of high signal intensity, i.e., more bright.

If the underlying $T_1$ has previously been estimated, for example using Despot1, then it is possible to account for these variations in $T_1$. Because the sequence parameters and $T_1$ are known, γ can be calculated and $M_0^{Bold}$ corrected. This corrected parametric map, $M_0^{Bold}/\gamma$ should be closer to the $M_0$ computed from multiple flip angle images. FIGS. 4 (*a*)-(*f*) show $M_0$, (left, FIGS. 4(*a*), 4(*d*)) $M_0^{Bold}/\gamma$ (middle, FIGS. 4(*b*) and 4(*e*)) and the percentage difference (right, FIGS. 4(*c*),(*f*)) between the two parametric maps for the same patients as in FIGS. 3 (*a*)-(*f*). The shape of $M_0$ and $M_0^{Bold}/\gamma$ correspond more closely, and we see that areas which previously contained significant amounts of errors (FIGS. 3(*c*) and (*f*) now have a markedly reduced errors, particularly around the tumor deposits and vessels, in FIGS. 4(*c*) and 4(*f*). Errors remain in the center of FIG. 4(*c*), which is caused by partial volume effects.

In FIGS. 3(*c*), 3(*f*), 4(*c*), and 4(*f*) the liver is the region of interest, because the Despot1 sequence parameters have been optimized for the estimation of $T_1 \approx 600$ ms. The errors in $T_1$ for other organs, having significantly different $T_1$ values (e.g. $T_1^{spleen} \approx 1057$ ms or $T_1^{kidney} \approx 1400$ ms), would be larger resulting in an incorrect computation of γ and hence an incorrect scaling of $M_0^{Bold}$. However, a reduction in errors in all abdominal organs is observed.

As a further performance indicator, the value for σ/μ of $$\frac{M_0^{Bold}}{M_0}$$

and $$\frac{M_0^{Bold}/\gamma}{M_0}$$

within liver was computed. If the two independent approaches to estimate $M_0$ are equivalent, then their ratio should be constant everywhere, and the ratio of the standard deviation $\sigma$ and mean $\mu$ should be relatively small. The absolute value of $M_0$ can vary across the image. The results for the two examples are given in Table 3 below.

TABLE 3

|  | σ/μ | σ/μ with γ correction |
|---|---|---|
| Patient 1 | 0.1474 | 0.1234 |
| Patient 2 | 0.0877 | 0.0600 |

As expected, a reduction of $\sigma/\mu$ when the value of $\gamma$ is taken into account is observed. This means that relatively speaking, $M_0^{Bold}/\gamma$ is more similar to $M_0$ than $M_0^{Bold}$ is to $M_0$.

Thus by using the exemplary method discussed herein, the computation of $M_0$ is independent of $\alpha$ based on a different pulse sequence with different parameters. Because $M_0$ contains $\vec{B}$ we can conclude that $\vec{B}$ is independent of $\alpha$ and the pulse sequence used. Further, the term $M_0^{Bold}$ differs from $M_0$ through the multiplicative term $\gamma = \sin \alpha$ $$\left( \frac{1 - e^{-TR/T_1}}{1 - \cos\alpha \cdot e^{-TR/T_1}} \right).$$

Furthermore, the following relationship holds true: $M_0^{Bold}/\gamma \approx M_0$. Rather than correcting $M_0^{Bold}$ (which requires $T_1$ and thus automatically gives $M_0$ as well), it is easier to use $M_0$ directly to remove the bias field.

Reference is now made to FIG. 6, which depicts a flowchart of an embodiment of a method of the present disclosure for removing intensity inhomogeneities from an MR image. It should be noted that in accordance with some embodiments, the functions noted in the blocks can occur out of order (or not at all). For example, two blocks shown in succession may in fact be executed substantially concurrently or in reverse order, depending on the particular embodiment.

Beginning in step 710, an MR image is acquired. In step 720, one or more calibration image acquisitions is performed, preferably a plurality of calibration image acquisitions is performed while varying a flip angle, $\alpha$. A wide range of choice of flip angles and repetition times TR is possible. In an exemplary embodiment at least two flip angles are preferred and we choose a TR<<T1 which makes our approach particularly fast. One possible method to choose the TR and flip angles has been described by Deoni et al. (Magn Reson Med, vol. 51, 194-1999, 2004). In general, any flip angle from 1 to 90 can be used. The preferred flip angles are those that optimize the accuracy of the computed calibration factor $M_0$.

In an exemplary embodiment the one or more calibration images acquired in step 720 should cover an area equal to or larger than any images acquired in 710. The resolution, thickness and orientation of images in 720 need not be the same as the images acquired in 710. For some embodiments, an optional registration step (i.e., alignment function) (step 730) may be performed on the series of images acquired in step 720.

There are several options for alignment and some examples are described in the following. One could either align the individual images 720 to each other prior to computing $M_0$. It would also be possible to align the individual images 720 to a reference volume and then compute $M_0$. It is also possible to align the images from 720 to 710, or put the multitude of these images (i.e., all or a subset of 710 and 720) into a Transitive Inverse Consistent Framework. After the alignment the calibration factor $M_0$ would be computed.

The optional alignment step may be performed according to methods known in the art. Exemplary methods for alignment have been indicated in above and exemplary opportunities for alignment in [0060]. In step 740, a bias field is calculated based on the series of image acquisitions. This bias field is then removed from the MR image in order to remove inhomogeneities from the MR image (step 760a).

It should be noted that the calculated bias field from 740 can be optionally aligned to the image acquired in step 710 using conventional methods. Because the resolution and/or the orientation of the bias field (which may have the same resolution as the images acquired in step 720) and the MR image acquired in step 710 may be different, interpolation (e.g., linear, cubic splines, trilinear, etc.) and re-sampling may be performed either on the MR image resolution of step 710, 720, 740 or the computed $M_0$ if necessary (or desired). The images acquired in steps 710 and 720 can be further incorporated into one or more recent registration algorithms such as a Transitive Inverse-consistent registration algorithm, for example.

The series of images from step 720 or the image computed from the series of images (740) may (optionally) be subject to image processing to remove artifacts and to address noisy data (e.g., by incorporating a noise model and/or noise reduction step). As one possibility, the images may be smoothed or low pass filtered, Gaussian or median filtered (step 750). Another possibility may be to use Markov Random Fields (see e.g. C. Xiaohua, "Simultaneous segmentation and registration of medical images," DPhil Thesis Wolfson Medical Vision Laboratory, Department of Engineering Science. Oxford: University of Oxford, 2005 and references therein. Yet another possibility is the fitting of a surface to the $M_0$, or its noise corrected version. Because the bias field can be expected to vary smoothly, it is acceptable to reduce the image acquisition matrix of the individual images acquired in step 720. It should be noted that a high resolution image that matches the resolution of the image 710 is desirable but not compulsory.

As depicted in step 760b (as an alternative to step 760a), the bias field estimated in step 740 based on the one or more acquired calibration images can be combined with image based approaches to remove the estimated bias field in one of the following ways: 1) through an initialization step in accordance with existing bias field removal algorithms such as those taught, for example, by Styner et al. (IEEE Trans Med Imaging, vol. 19, pp. 153-65, 2000), Guimond et al. (IEEE Trans Med Imaging, vol. 20, pp. 58-69, 2001), Guillemaud et al. (IEEE Trans Med Imaging, vol. 16, pp. 238-51, 1997), and Sled et al. (IEEE Trans Med Imaging, vol. 17, pp. 87-97, 199); and 2) by combining the computation of step 740 with existing bias field removal algorithms into an iterative framework using, for example, an Expectation Maximization Framework or a Bayesian Framework. It should be noted that this is analogous to combining segmentation and registration (SSR, see for example Xiaohua et al. (DPhil Thesis, Oxford University, 2005 or IPMI July 2005 Glenwood Springs, Colo., USA)) into a single integrated process, which effectively interleaves the estimation of both processes, thereby improving the overall accuracy.

One skilled in the art would also recognize that removal of the estimated bias field can be accomplished by alternate means. One option is to divide the image to be corrected, I, by the optionally processed (e.g. to account for noise) calibration factor $M_0$ to derive a corrected image. An alternative approach is the subtraction of the logarithmic transformed images. This means that the operation $I/M_0$ is equivalent to $\log(I)-\log(M_0)$ and calculating the exponential of $(\log(I)-\log(M_0))$. A number of bases can be chosen. As an example one can consider the base 10, 2 or e (approx 2.71). While the results are similar, the second approach may offer a considerable speed improvement. There may be other choices of transformation of images which have the same effect, that is to reduce the inhomogeneities on an acquired image through using the calibration factor $M_0$.

It should be emphasized that the removal of the estimated bias field may be preferred on pixels which do not make up part of the background or on a user defined region of interest. As such, in alternative embodiments, an additional step may be included whereby pixels which are not part of the background are identified. Generally, to correct the images, the uncorrected image is divided by $M_0$ (or using the logarithmic operation), as described earlier (see [0065]) or a processed (e.g. smoothened) version of $M_0$. This changes the numerical value of each pixel in the corrected image quite drastically (e.g., from 70 to 0.005). As such, a normalization step should also be performed in order to convert the intensities associated with the corrected image back to the same mean. This can be accomplished by scaling $M_0$ prior to performing the division step. For such embodiments, the relative variation of the $M_0$ values within the image is unchanged, but their magnitudes are scaled. For instance, the range may vary from 0 to 1 or from −1 to 1. For alternative embodiments, normalization can be accomplished by scaling the corrected image so that for example the mean of the uncorrected and corrected image are approximately the same. As noted above (e.g., in [0057]) the execution of the individual steps can be conducted in any order and some of these steps could be conducted multiple times. The following illustrates some possible combinations of the execution of the individual steps. Variations thereof are of course possible. For example the noise reduction step can be applied to the individual images with varying alpha before $M_0$ is computed, or, the noise reduction could be applied to the $M_0$ image computed from the original images with varying alpha. Of course, noise reduction techniques can be applied before and after the computation of $M_0$. Similarly, as described in [0060] the alignment step can occur at various points. The re-sampling of the images can also occur at various points. One option is the re-sampling (after optional alignment and noise reduction) of the multiple images with varying alpha, 720, to the size and orientation of 710 prior to computation of $M_0$. Similarly, it would be possible to compute $M_0$ first (after optional alignment and noise reduction) and then resample the computed $M_0$ to the size and orientation of 710. Noise reduction and alignment can be applied to any intermediate step of the process.

Reference is now made to FIGS. 7A-D, which show the results for various approaches to bias field removal for four cases. In particular, for each case, the original image is shown, along with the results from three approaches to removing the bias field: 1) method 1, 2) method 2, and 3) the method described herein. The method 1 improves the image quality of images acquired using surface coils by correcting the low spatial frequency intensity modulations. The method reduces noise and enhances the contrast in the image. The method produces a series of filtered images with decreased intensity near the coil, reducing areas of bright spots. The method 2 reduces surface coil intensity variation through a calibration process and uses a calibration scan.

The results shown in FIGS. 7A-D were produced as follows. DESPOT1 data was acquired at 1.5 T with TR=3.7 msec, TE=1.5 msec, 5 mm thick slices, and a 256×256 matrix were used covering the whole phantom (30 slices). The acquired flip angles were 1, 2, 3, 4, 5, 6, 7, 8, 9, 10, 11, 12, 13, 14, 15 degrees. From this data, $T_1$ and M, were calculated. $T_2$ weighted fat saturated images SE (Fast Spin Echo) with TR=2000 msec, TE=96 msec, 5 mm slice thickness, 256×224 matrix, flip angle=90 degree, 32 slices covering the whole phantom were acquired. $T_1$ weighted GRE (Gradient Echo) TR=7.9 msec, TE=4.2 msec, 5 mm slice thickness, 288×128 matrix, flip angle 30 degree, 32 slices covering the whole phantom were acquired. Corresponding slices in the data sets were chosen and the images were sampled to have the same resolution and image size. The $T_1$ and $T_2$ weighted images were corrected using the exemplary method described herein. The $T_1$ and $T_2$ weighted images were also corrected using method 1 and method 2. Normalized intensity plots (i.e., all normalized to 1) for representative slices along the shown lines were plotted on the same axis.

Removal of Inaccuracies in Transmitted RF Magnetic Field $B_1^+$

The system described so far corrects for what is often termed the bias field. An alternative description are inhomogeneities in the magnetic $B_1$ receive field ($B_1^-$). The approach can be extended to correct for another frequently occurring artifact which can be called inhomogeneities in the radiofrequency (RF) magnetic transmit ($B_1^+$) field. Such artifacts become particularly important at higher field strength (3T and higher), which are increasingly being used in the daily clinical routine. However, they also occur at the currently used field strengths (1.5T and less).

Ideally, the RF transmit field would be perfectly uniform, resulting in a uniform distribution of the prescribed flip angle. However, numerous factors make this assumption invalid. These can be due to the conductive and dielectric properties of tissue resulting in standing waves with constructive and destructive interference and RF attenuation. These effects become more prominent at higher field strength as the wavelength of the RF pulse and the size of the imaged object become more comparable.

The correction of such artifacts is important for the quantitative measurements, such as the estimation of the longitudinal relaxation time $T_1$. These artifacts however also negatively affect the visual appearance of images. The qualitative assessment of images can thus also benefit from a correction technique.

$B_1^+$ Mapping Strategies

To those skilled in the art numerous approaches are known for mapping the radiofreqency (RF) transmit field $B_1^+$.

Deoni et al. (2007) ("High-Resolution $T_1$ Mapping of the Brain at 3 T with Driven Equilibrium Single Pulse Observation of $T_1$ with High-Speed Incorporation of RF Field Inhomogeneities (DESPOT1-HIFI)", Journal of Magnetic Resonance Imaging, 26:1106-1111) describe an approach which can be combined with the above described approach. Through acquisition of at least one additional inversion prepared SPGR image it is possible to estimate a $B_1^+$ map. This approach may be desirable as it provides a particularly fast method for estimating a $B_1^+$ map and has been shown to work at 3T.

Alternatively, other approaches to estimate a $B_1^+$ map are also known. Alsop et al. (1997) ("In vivo Mapping of B1 Uniformity Produced by a Whole Body 3T RF Coil", Proceedings of the International Society For Magnetic Resonance in Medicine, p. 1094), describe a $B_1^+$ mapping technique using a modified single-shot fast spin echo (SSFSE) sequence.

J Mihara et al. (2005) ("A method for an accurate $T_1$ relaxation-time measurement compensating B1 field inhomogeneity in magnetic-resonance imaging", Journal of Applied Physics 97, 10E107) describe a method in which three MR images with different flip angles and repetition times are acquired. Image A and B share the same TR (TR1), while having different flip angles (alpha1 and alpha2, respectively). Image C uses a different TR, TR2, and the same flip angle as image A (alpha1). All images are acquired with a multi-sliced spoiled gradient echo sequence on a 1.5T scanner, making the approach reasonably fast. By using the signal equations and the Bloch equation Mihara et al. obtain an estimate of the actual flip angle (rather than the prescribed, nominal, flip angle) and $T_1$.

A simple $B_1^+$ mapping strategy acquires an image with two different flip angles, alpha1 and alpha2 with the condition that $TR \gg T_1$. This is necessary to allow full relaxation of the spins. The $B_1^+$ field is then obtained by dividing the two images. The long repetition time however means that this strategy can require several minutes to obtain a full $B_1^+$ map. Cunningham et al. (2006) ("Saturated Double-Angle Method for Rapid $B_1^+$ Mapping", Magnetic Resonance in Medicine 55:1326-1333) describe a double angle method which works accurately even if $TR \ll T_1$, allowing the determination of a $B_1^+$ map in a single breath hold (i.e. around 20 seconds). This is done through using a $B_1$ insensitive magnetization reset sequence at the end of each data acquisition and a interleaved spiral readout. Cunningham et al. show results for phantom, leg, abdominal and cardiac imaging. Further details are available in the cited reference.

The choice of $B_1^+$ mapping technique may be personal preference or technical ease of implementation. In each case the necessary data (calibration images) would be acquired for a patient. This could, for example be acquired shortly before or after the calibration images for the correction of the bias field has been acquired. From this data a $B_1^+$ may be obtained, for example by one of the methods described above.

An exemplary embodiment of a method of the present disclosure for calculating and removing an estimated transmitted RF magnetic field $B_1^+$ in conjunction with removing an estimated bias field from an MR image is illustrated in FIG. 8. As can be seen FIG. 8 is a modified version of FIG. 6 described above. Like reference numerals in FIG. 8 designate corresponding blocks and steps to those described in connection with FIG. 6 above and, for brevity, will not be repeated here. As can be seen in FIG. 8, two sets of artifacts are involved. One set of artifacts involves the calculation of an estimated bias field and removal of the calculated bias field from an MR image, as described for example with reference to FIG. 6 above. The calculation and removal of an estimated bias field involves the acquisition of at least two data sets. One data set is obtained through the acquisition of an MR image. Another data set is obtained through the acquisition of one or more calibration images. From these two sets of data an estimated bias field can be calculated including, for example, calibration factor $M_0$ as described above. Additionally, the further calibration images can be used to calculate an estimated transmitted RF magnetic field $B_1^+$ to additionally remove from the MR image inhomogeneities resulting from inaccuracies in the transmitted RF magnetic field. This involves, for example, acquisition of a third image scan (step 720) from which an estimated transmitted RF field $B_1^+$ can be calculated or mapped, as illustrated in step 840 in FIG. 8, by using any of the aforementioned $B_1^+$ mapping techniques.

The resulting $B_1^+$ map may be smoothened 850, similarly to the smoothing operation 750 applied to the $M_0$ map. The smoothened version of the $B_1^+$ map can then be employed to remove or correct RF transmit inhomogeneities 860a or 860b by removing the calculated $B_1^+$ field.

The removal of RF transmit $B_1^+$ inhomogeneities can optionally be done on the original image or the image where the bias field has already been removed. Either of these will in the subsequent text be represented by I. One possible correction approach is through either division of the image to be corrected by the optionally processed $B_1^+$ map, or by taking the logarithm of the image to be corrected (i.e. log(I) and the optionally processed calibration factor $B_1^+$, i.e. $\log(B_1^+)$, forming the difference, i.e. $\log(I)-\log(B_1^+)$, and optionally computing the exponential of this difference, i.e. $\exp(\log(I)-\log(B_1^+))$, wherein the base of the logarithm and exponential operation can be any suitable choice. A number of bases can be chosen. As an example one can consider the base 10, 2 or e (approx 2.71). While the results are similar, the second approach may offer a considerable speed improvement. There may be other choices of transformation of images which have the same effect, that is to reduce the inhomogeneities on an acquired image through using the estimated $B_1^+$.

A more advanced correction technique would calculate a correction factor from the optionally smoothened $B_1^+$ map which is derived through a series of linear and non-linear operations on the $B_1^+$ map, such as addition, subtraction, multiplication, division, logarithms, exponentials and trigonometric functions (e.g. sin, cos, tan and their inverse).

The 'error' in the MR signal due to inaccurate flip angles can be non-linearly related to the longitudinal relaxation time $T_1$. The $T_1$ values vary over short distances depending on the underlying tissue class. The preferred $B_1^+$ mapping approach may also yield an estimate of $T_1$ and $M_0$. It is thus possible to use an estimate of the $T_1$ and $M_0$ values to obtain, together with the optionally processed/smoothed $B_1^+$ estimate, a new correction map. To obtain thus a new correction map it may be desirable to include a model of the signal formation for the image to be corrected (Math-based approach combined with image-based approach, as illustrated by step 860b) which can include information from the $T_1$ and/or $M_0$ maps. Other, alternative approaches to use the information from the estimated $B_1^+$ map to correct an image may also be possible.

It should be emphasized that the above described embodiments are merely examples of possible implementations. Many variations and modifications may be made to the above-described embodiments without departing from the principles of the present disclosure. For example, while some exemplary embodiments refer to relaxation time values at 1.5 T (tesla), other fields can be used. In an exemplary embodiment, tesla (T) values of 0.2 to 3 can be used. Also, while exemplary embodiments of the methods and systems herein are described in the context of clinical systems, they are not so limited. They can also be employed in pre-clinical systems, small bore systems, and animal MR scanners. All such modifications and variations are intended to be included herein within the scope of this disclosure and protected by the following claims.

At least the following is claimed:

1. A method for removing intensity inhomogeneities in magnetic resonance (MR) images comprising:
    acquiring an MR image for a body of tissue using a scanner;
    acquiring at least two calibration images, varying a flip angle α for the acquisition of the calibration images;
    determining from the at least two calibration images a calibration factor $M_0$, $M_0$ being a function of the gain setting g associated with the scanner and the proton density ρ;
    determining an estimated bias field; and
    removing the estimated bias field from the MR image through use of the calibration factor $M_0$ to derive an MR image in which inhomogeneities have been reduced.

2. The method of claim 1 where one or more additional calibration images are acquired to compute an estimate of the radiofrequency (RF) transmit $B_1^+$ field and inaccuracies in the estimated $B_1^+$ field are removed from one or more of the MR image, the calibration images or the calibration factor $M_0$, to obtain data in which inhomogeneities have been reduced.

3. The method of claim 1 where the signal of the calibration images can be approximated by the following formula $$S = g\rho e^{-TE/T_2} \sin\alpha \frac{1 - e^{-TR/T_1}}{1 - \cos\alpha e^{-TR/T_1}} B$$

and $M_0$ is approximated by the following formula $M_0 = g\rho e^{-TE/T_2} B$, where B is the estimated bias field, g is the scanner gain, ρ is the proton density, TE is the echo time, TR is the repetition time, α is the flip angle, T1 and T2 are the longitudinal and transverse relaxation time, respectively and $M_0$ is calculated from the plurality of images acquired while varying α.

4. The method of claim 1, further including one or more of the following steps:
    an initialization step;
    performing normalization of any one or more of the various images;
    performing rigid or non-rigid registration; and
    a noise reduction or suppression step.

5. The method of claim 1, wherein removing the estimated bias field is conducted through either division of the image to be corrected by an optionally processed calibration factor $M_0$ or by taking the logarithm of the image to be corrected and the logarithm of the optionally processed calibration factor $M_0$, forming the difference of the logarithm of the image to be corrected and the logarithm of the optionally processed calibration factor, and optionally computing the exponential of this difference, wherein the base of the logarithms and exponential operation can be any suitable choice.

6. The method of claim 1, further including one or more of the following steps:
    estimating the inhomogeneities at a number of positions within the MR images; and
    removing the inhomogeneities is conducted on pixels which do not make up part of the background or on a user defined region of interest of the MR image.

7. The method of claim 1, further including combining the determining of the estimated bias field into an iterative framework, wherein the iterative framework is either an Expectation Maximization Framework or a Bayesian Framework.

8. The method of claim 1, wherein the calibration images are obtained for a plurality of flip angles and the flip angles are selected to optimize the accuracy of a calculated calibration factor.

9. The method of claim 1, further including the step of changing the resolution or orientation of one or more of the various images and resampling the images.

10. The method of claim 1, wherein one or more of the various images may have the same or different image acquisition matrices.

11. The method of claim 1, where the calibration images and/or the estimated bias field are subject to a series of linear and non-linear operations.

12. The method of claim 1, wherein the choice of the echo time TE for the acquisition of the calibration images is such as to justify the approximation $$e^{-TE/T^*_2} \approx 1.$$

13. The method of claim 2, wherein removing the inaccuracies in the estimated $B_1^+$ field from the MR image is conducted through either division of the image to be corrected by the computed $B_1^+$ field, or by taking the logarithm of the image to be corrected, and the logarithm of the computed $B_1^+$ field, forming the difference of the logarithm of the image to be corrected and the logarithm of the computed $B_1^+$ field, and computing the exponential of this difference, wherein the base of the logarithms and the exponential operation can be any suitable choice.

14. The method of claim 2, further including one or more of the following steps:
    an initialization step;
    performing normalization of any one or more of the various images;
    performing rigid or non-rigid registration; and
    a noise reduction or suppression step.

15. The method of claim 2, further including one or more of the following steps:
    estimating the inhomogeneities at a number of positions within the MR images; and
    removing the inhomogeneities is conducted on pixels which do not make up part of the background or on a user defined region of interest of the MR image.

16. The method of claim 2, further including combining the determining of the estimated bias field into an iterative framework, wherein the iterative framework is either an Expectation Maximization Framework or a Bayesian Framework.

17. The method of claim 2, wherein the calibration images are obtained for a plurality of flip angles and the flip angles are selected to optimize the accuracy of a calculated calibration factor.

18. The method of claim 2, further including the step of changing the resolution or orientation of one or more of the various images and resampling the images.

19. The method of claim 2, wherein one or more of the various images may have the same or different image acquisition matrices.

20. The method of claim 2, where the calibration images and/or the estimated bias field are subject to a series of linear and non-linear operations.

21. The method of claim 2, wherein the choice of the echo time TE for the acquisition of the calibration images is such as to justify the approximation $$e^{-TE/T^*_2} \approx 1.$$

* * * * *